(12) United States Patent
Satou (10) Patent No.: US 7,662,430 B2
(45) Date of Patent: Feb. 16, 2010

(54) CERAMIC ELECTRONIC COMPONENT AND METHOD FOR MANUFACTURING THE SAME

(75) Inventor: Hisashi Satou, Kokubu (JP)

(73) Assignee: Kyocera Corporation, Kyoto (JP)

( * ) Notice: Subject to any disclaimer, the term of this patent is extended or adjusted under 35 U.S.C. 154(b) by 457 days.

(21) Appl. No.: 11/223,212

(22) Filed: Sep. 8, 2005

(65) Prior Publication Data

US 2006/0049131 A1    Mar. 9, 2006

(30) Foreign Application Priority Data

Sep. 9, 2004    (JP)    ............................. 2004-261772

(51) Int. Cl.
*B05D 5/12*    (2006.01)
(52) U.S. Cl. ..................... 427/98.3; 427/97.7
(58) Field of Classification Search ................ 427/97.7, 427/98.3
See application file for complete search history.

(56) References Cited

U.S. PATENT DOCUMENTS

| | | | | |
|---|---|---|---|---|
| 4,465,727 A | * | 8/1984 | Fujita et al. .................. 428/138 |
| 5,029,242 A | * | 7/1991 | Sammet ....................... 174/257 |
| 5,496,619 A | * | 3/1996 | Itagaki et al. ................ 428/209 |
| 5,503,777 A | * | 4/1996 | Itagaki et al. .......... 252/519.21 |
| 5,560,851 A | * | 10/1996 | Thimm et al. ................ 219/543 |
| 6,846,375 B2 | * | 1/2005 | Hayama et al. .......... 156/89.16 |
| 7,169,331 B2 | * | 1/2007 | Nakamura et al. .......... 252/512 |

FOREIGN PATENT DOCUMENTS

| JP | 05-314810 | 11/1993 |
|---|---|---|
| JP | 10-341067 | 12/1998 |
| JP | 2003-123534 | 4/2003 |
| JP | 2003-229325 | 8/2003 |

* cited by examiner

*Primary Examiner*—Brian K Talbot
(74) *Attorney, Agent, or Firm*—Hogan & Hartson LLP (57) ABSTRACT

The present invention relates to a ceramic electronic component wherein via conductors that are embedded in through holes of dielectric layers formed from a sintered body of ceramic particles are made by firing a electrically conductive paste for via conductor that contains inorganic particles made of the same material as the ceramic particles that constitute the dielectric layer and having an average particle diameter smaller than that of the ceramic particles, and a method for manufacturing the same. According to the present invention, such a ceramic electronic component can be provided that the via conductors and the internal electrodes are electrically connected with each other satisfactorily without voids generated therein.

6 Claims, 4 Drawing Sheets

CERAMIC ELECTRONIC COMPONENT AND METHOD FOR MANUFACTURING THE SAME

BACKGROUND OF THE INVENTION

The present invention relates to a ceramic electronic component comprising dielectric layers formed from a sintered body of ceramic particles and having through holes and via conductors embedded in the through holes of the dielectric layers, and a method for manufacturing the ceramic electronic component.

Recently, ceramic electronic components, especially those comprising two or more dielectric layers stacked one on another such as laminated ceramic capacitor, are increasingly made in such a structure that wiring conductors provided inside of the laminated structure (between the layers) are electrically connected with via conductors that penetrate the ceramic electronic component in the direction perpendicular to the layers, in order to decrease the equivalent series resistance and equivalent series inductance of the wiring conductors.

Figure 9:
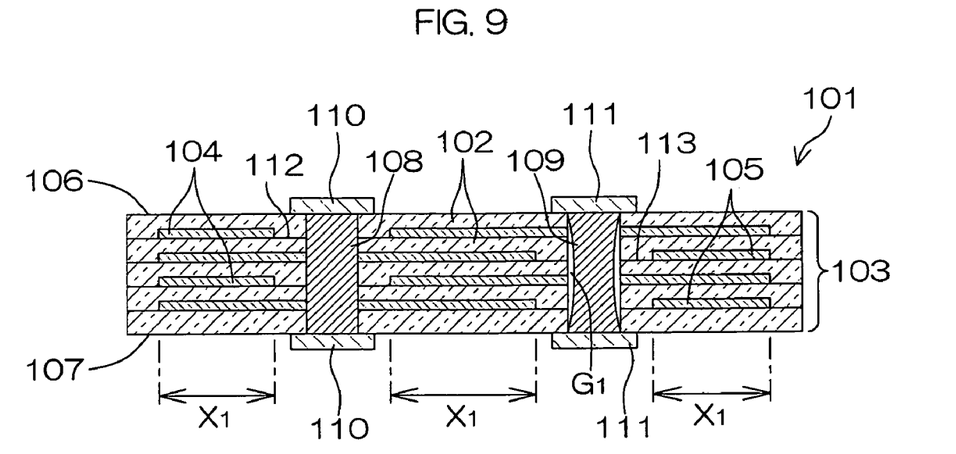
FIG. 9 is a sectional view showing a laminated ceramic capacitor as an example of the ceramic electronic component of the prior art.

FIG. 9 is a sectional view showing an example of laminated ceramic capacitor 101 that employs the structure described above. Referring to FIG. 9 the laminated ceramic capacitor 101 in this example has a dielectric block 103 formed by stacking a plurality of dielectric layers 102 made of ceramics.

Provided between the dielectric layers 102 that constitute the dielectric block 103 are internal electrodes 104 and 105 disposed in plurality alternately as the wiring conductors. The dielectric block 103 has via conductors 108 and 109 formed therein so as to penetrate the dielectric block 103 from the top surface 106 to the bottom surface 107 thereof in the direction perpendicular to the stacked layers, while an external electrode 110 that is electrically connected to the via conductor 108 and an external electrode 111 that is electrically connected to the via conductor 109 are formed on the top surface 106 and the bottom surface 107 of the dielectric block 103, respectively.

The internal electrodes 104 are provided on the upper surfaces of the dielectric layers 102 that are disposed as even-numbered layers counting from the top surface 106 of the dielectric block 103, and the via conductor 109 is electrically connected while providing an area 112 that has no electrode formed around the via conductor 108 so as to prevent the electrodes 104 from touching the via conductor 108.

The internal electrodes 105 are provided on the upper surfaces of the dielectric layers 102 that are disposed as odd-numbered layers (except for the top layer, namely the first dielectric layer 102) counting from the top surface 106 of the dielectric block 103, and the via conductor 108 is electrically connected while providing an area 113 that has no electrode formed around the via conductor 109 so as to prevent the electrodes 105 from touching the via conductor 109.

The internal electrodes 104 that are electrically connected to the external electrode 111 through the via conductor 109 and the internal electrodes 105 that are electrically connected to the external electrode 110 through the via conductor 108 are disposed opposite to each other with the dielectric layer 102 therebetween in an area $X_1$ shown in the figure, so as to form a circuit that equivalently functions as a capacitor.

The dielectric block 103 is formed by stacking ceramic green sheets containing ceramic particles and an organic binder resin, of which the dielectric layers 102 are made by the same number as the number of the dielectric layers 102, and firing the stack. The internal electrodes 104 and 105 are formed by applying an electrically conductive paste for wiring conductor that contains Ni powder and the like as an electrically conductive component and an organic binder resin, by screen printing or the like in a predetermined planar configuration on the surfaces of the ceramic green sheets prior to stacking, and firing together with the stacked ceramic green sheets.

The via conductors 108 and 109 are formed, for example, by filling the through holes formed in the stacked ceramic green sheets with an electrically conductive paste for via conductor and firing together with the ceramic green sheets. The electrically conductive paste for via conductor may be an electrically conductive paste for via conductor that contains Ni powder, Cu powder and an organic binder resin, or an electrically conductive paste for via conductor that contains an Ni—Cu alloy powder instead of the Cu powder and the Ni powder, as described in Japanese Unexamined Patent Publication No. 2003-123534.

In these electrically conductive pastes for via conductors, Cu is considered to form solid solution with Ni when fired, so as to achieve satisfactory electrical connection of the via conductors 108 and 109 and the internal electrodes 104 and 105.

However, since the ceramic green sheets and the electrically conductive paste for via conductor show different shrinkage behaviors, namely different values of shrinking rate and amount of shrinkage when fired, and sintering of metal powders contained in the electrically conductive paste for via conductor starts in an early stage at a temperature lower than the sintering starting temperature of the ceramic particles in the ceramic green sheets when fired, voids $G_1$ tend to be formed in the interface between the dielectric layer 102 and the via conductors 108 and 109 even when Cu is contained in the electrically conductive paste for via conductor. When the voids $G_1$ are formed in the interface, reliability of connection decreases due to problems such as failure of electrically connecting the via conductors 108 and 109 and the internal electrodes 104 and 105.

In order to solve the problem described above, it has been proposed to add a specific amount of the same ceramic particles (hereinafter referred to as "inorganic particles") as the ceramic particles to be contained in the ceramic green sheet to the electrically conductive paste for via conductor, and thereby shift the sintering starting temperature of the electrically conductive paste for via conductor as a whole to a higher temperature, so that the ceramic green sheet and the electrically conductive paste for via conductor have the same shrinking rate and shrinkage amount (Japanese Unexamined Patent Publication No. 2003-229325).

However, when the electrically conductive paste for via conductor contains more inorganic particles, the via conductors 108 and 109 have higher conductive resistance and/or become more likely to break.

Therefore, the inorganic particles to be contained in the electrically conductive paste for via conductor should be limited to be in small quantity. In this case, however, the effect of shifting the sintering starting temperature of the electrically conductive paste for via conductor to a higher temperature produced by adding the inorganic particles is not exerted sufficiently enough to prevent the voids $G_1$ from appearing on the interface between the dielectric layer 102 and the via conductors 108 and 109 effectively.

That is, with the use of the conventional inorganic particles, unless larger quantity of particles are added, it is difficult to prevent the voids $G_1$ from appearing on the interface between the dielectric layer 102 and the via conductors 108 and 109.

SUMMARY OF THE INVENTION

An object of the present invention is to provide a ceramic electronic component where via conductors and internal electrodes are electrically connected satisfactorily by effectively preventing voids from appearing on the interface between dielectric layers and via conductors. Another object of the present invention is to provide a method for manufacturing the ceramic electronic component.

The present invention provides a ceramic electronic component comprising dielectric layers made of a sintered body of ceramic particles and having through holes and via conductors embedded in the through holes of the dielectric layers, wherein the via conductors are formed by firing the electrically conductive paste for via conductor that contains inorganic particles made of the same material as the ceramic particles that constitute the dielectric layer and having an average particle diameter smaller than that of the ceramic particles.

According to the present invention, the ceramic particles and the inorganic particles that have particle diameter smaller than that of the ceramic particles and therefore have a slightly lower sintering starting temperature can be bonded in the interface between the ceramic green sheets that are precursors of the dielectric layers and the electrically conductive paste for via conductor that is the precursor of the via conductors in the early stage of firing, before the ceramic particles are sintered with each other in the ceramic green sheets.

Therefore, voids can be prevented from appearing on the interface between the dielectric layers and the via conductors due to the difference in shrinkage behavior between the ceramic green sheets and the electrically conductive paste for via conductor during shrinkage thereof, by causing the bonded ceramic particles and the inorganic particles to function as the anchor that fixed the ceramic green sheets and the electrically conductive paste for via conductor together.

Therefore, as compared with a case where inorganic particles, which are the same ceramic particles as the ceramic particles contained in the ceramic green sheet, are added to the electrically conductive paste for via conductor, namely, a case where the diameter of the ceramic particles is the same as the diameter of the inorganic particles, the present invention can provide the ceramic electronic component wherein satisfactory electrical connection is established between the via conductors and the internal electrodes by preventing voids from appearing on the interface between the dielectric layer and the via conductors without adding large quantity of inorganic particles.

Also according to the present invention, even better electrical connection can be achieved between the via conductors and the internal electrodes by improving the tenacity of the dielectric layer and the via conductors, when the ceramic particles and the inorganic particles are bonded together in the interface between the dielectric layers and the via conductors. As a result, electrical characteristics of the ceramic electronic component can be stabilized.

The present invention provides a method for manufacturing the ceramic electronic component of the present invention described above. The method comprises the steps of forming through holes in ceramic green sheets containing ceramic particles; filling the through holes with an electrically conductive paste for via conductor containing the inorganic particles of the same material as the ceramic particles and having an average particle diameter smaller than that of the ceramic particles; and firing the ceramic green sheets and the electrically conductive paste for via conductor.

According to the present invention, as described above, the ceramic particles and the inorganic particles can be reliably bonded together in the interface between the ceramic green sheets and the electrically conductive paste for via conductor in the early stage of firing, before the ceramic particles are sintered with each other in the ceramic green sheets, as described above. As a result, better electrical connection can be established between the via conductors and the internal electrodes.

In the method of the present invention, it is preferable to set the starting temperature $T_1$ for sintering the ceramic particles contained in the ceramic green sheets with the inorganic particles contained in the electrically conductive paste for via conductor, the starting temperature $T_2$ for sintering the ceramic particles with each other and the starting temperature $T_3$ for sintering the inorganic particles with each other are set so as to satisfy both relationships (1) and (2).

$$T_1 < T_2 \tag{1}$$

$$T_1 < T_3 \tag{2}$$

Under these conditions, the ceramic particles and the inorganic particles that have particle diameter smaller than that of the ceramic particles and therefore have a slightly lower sintering starting temperature can be more reliably bonded together in the early stage of firing, before the ceramic particles are sintered with each other in the ceramic green sheets and the inorganic particles are sintered with each other in the electrically conductive paste for via conductor. As a result, better electrical connection can be established between the via conductors and the internal electrodes.

The sintering starting temperatures $T_2$ and $T_3$ are preferably set so as to satisfy relationship (3).

$$T_2 \leq T_3 \tag{3}$$

Under this condition, the electrically conductive paste for via conductor shows shrinkage behavior similar to that of the ceramic green sheet. Therefore, it is made possible to reduce the internal stress generated in the via conductors and prevent voids and cracks from appearing in the via conductors due to shrinkage of the electrically conductive paste for via conductor while the electrically conductive paste for via conductor is fixed in the interface between the paste and the ceramic green sheets, by causing the ceramic particles and the inorganic particles to be sintered together and function as the anchor. Therefore the present invention can prevent the via conductors from having higher conductive resistance or breaking, thus making it possible to stabilize the electrical characteristics of the ceramic electronic component.

DETAILED DESCRIPTION OF THE INVENTION

Figure 1:
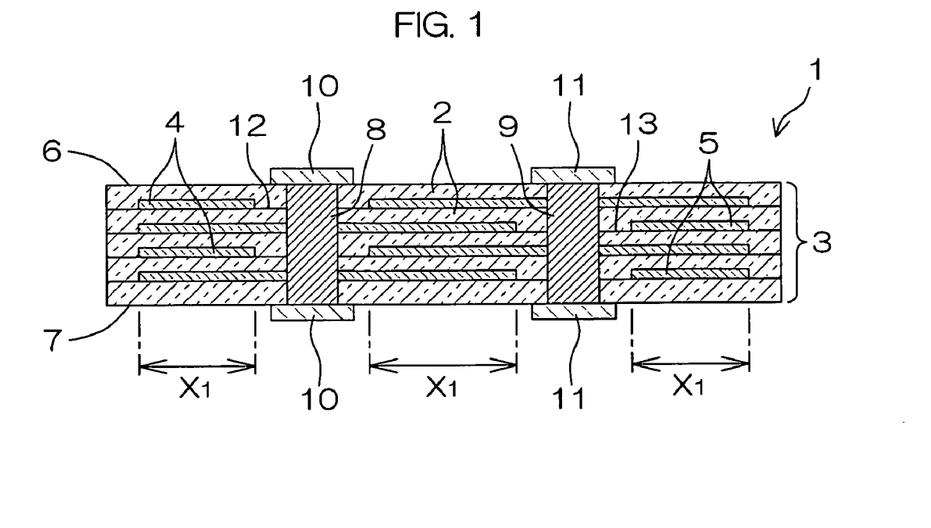
FIG. 1 is a sectional view showing a laminated ceramic capacitor as an example of the ceramic electronic component of the present invention.

FIG. 1 is a sectional view showing a laminated ceramic capacitor 1 as an example of the ceramic electronic component of the present invention. As shown in FIG. 1, the laminated ceramic capacitor 1 of this example has a dielectric block 3 formed by stacking a plurality of dielectric layers 2 made of ceramics.

Provided between the dielectric layers 2 that constitute the dielectric block 3 are internal electrodes 4 and 5 disposed in plurality alternately as the wiring conductors. The dielectric block 3 has via conductors 8 and 9 that penetrate the dielectric block 3 from the top surface 6 to the bottom surface 7 thereof in the direction perpendicular to the stacked layers, while an external electrode 10 that is electrically connected to the via conductor 8 and an external electrode 11 that is electrically connected to the via conductor 9 are formed on the top surface 6 and the bottom surface 7 of the dielectric block 3, respectively.

The internal electrode 4 is provided on the upper surfaces of the dielectric layers 2 that are disposed as even-numbered layers counting from the top surface 6 of the dielectric block 3, and the via conductor 9 is electrically connected while providing an area 12 that has no electrode formed around the via conductor 8 so as to prevent the electrodes 4 from touching the via conductor 8.

The internal electrode 5 is provided on the upper surfaces of the dielectric layers 2 that are disposed as odd-numbered layers (except for the top layer, namely the first dielectric layer 2) counting from the top surface 6 of the dielectric block 3, and the via conductor 8 is electrically connected while providing an area 13 that has no electrode formed around the via conductor 9 so as to prevent the electrodes from touching the via conductor 9.

The internal electrode 4 that is electrically connected to the external electrode 11 through the via conductor 9 and the internal electrode 5 that is electrically connected to the external electrode 10 through the via conductor 8 are disposed opposite to each other with the dielectric layer 2 therebetween in an area $X_1$ shown in the figure, so as to form a circuit that equivalently functions as a capacitor.

The dielectric block 3 is formed by stacking ceramic green sheets that contain ceramic particles and an organic binder resin to form the dielectric layers 2 by the same number as the number of the dielectric layers 2, and firing the stack. The ceramic green sheets are made, for example, by mixing the ceramic particles with a sintering aid, an organic binder resin, a plasticizer, a dispersant, a solvent and the like to form a slurry, forming the slurry into sheets and drying the sheets. The ceramic slurry may be formed into sheets, for example, by doctor blade method, pull-up method, application by means of a dye coater, application by means of a gravure roll or the like.

The ceramic particles may be such that is made by granulating a mixture of barium titanate ($BaTiO_3$), which is a main component, and a dielectric material such as magnesium titanate ($MgTiO_3$) and manganese titanate ($MnTiO_3$) and, as required, a compound of rare earth metal such as yttrium oxide ($Y_2O_3$).

Average particle diameter of the ceramic particles is preferably in a range from 0.2 to 0.6 μm, particularly from 0.3 to 0.5 μm, in order to form the dielectric layers 2 that have not only high dielectric performance but also precision and high strength.

In this specification, average particle diameters of the ceramic particles, the inorganic particles and the metallic powders used as the electrically conductive components are all given in terms of average values determined as follows. A sample of the powder is photographed under a scanning electron microscope. Diameters of 30 to 50 particles of which whole images are seen in the photograph are measured. The diameters are averaged to give the average particle diameter of the powder.

The sintering aid has a function to accelerate sintering of the ceramic particles in the ceramic green sheets and to accelerate bonding of the ceramic particles and the inorganic particles in the interface between the dielectric layers and the via conductors. The sintering aid includes, for example, a glass frit such as silicone oxide ($SiO_2$), boron oxide ($B_2O_3$) or lithium oxide ($Li_2O$).

The organic binder resin includes, for example, polyvinyl butyral resin, ethyl cellulose resins or acrylic resins. The plasticizer includes, for example, polyethylene glycol or phthalic acid esters. The solvent includes water as a water-soluble solvent, toluene, ethyl acetate, or terpineol as an organic solvent, or a mixture thereof.

The dispersant includes, for example, polycarboxylate type surfactants that is preferably used together with the water-soluble solvent, or polyoxyethylene ethers or an amphoteric surfactants as a dispersant that is preferably used together with the organic solvent.

The internal electrodes 4 and 5 are formed by applying an the electrically conductive paste for wiring conductor by screen printing or the like in a predetermined planar configuration on the surfaces of the ceramic green sheets prior to stacking, and firing together with the stacked ceramic green sheets.

As the electrically conductive paste for wiring conductor, for example, a paste that contains a metal powder as an electrically conductive component and an organic binder resin may be preferably used. Specifically, the electrically conductive paste for wiring conductor is prepared by adding a solvent that can dissolve the organic binder resin, to the metal powder and the organic binder resin, so as to dissolve the organic binder resin.

As the metal powder, Ni powder is preferably used of which average particle diameter is preferably in a range from 0.1 to 10 μm in order to prevent the Ni particles from aggregating in the electrically conductive paste for wiring conductor.

As the organic binder resin, various resins may be used that allow the metal powder to disperse evenly therein and can render the electrically conductive paste for wiring conductor proper level of viscosity and rheology which are appropriate for the method (screen printing or the like) of applying the paste onto the ceramic green sheet. The organic binder resin includes, for example, acrylic resin, phenol resin, alkyd resin, rosin ester, ethyl cellulose, methyl cellulose, polyvinyl alcohol or polyvinyl butyral.

As the solvent, various solvents that enable it to turn the mixture into a paste by dissolving the organic binder resin and allowing the metal powder to disperse therein can be used. The solvent includes, for example, alcoholic solvents (for example, α-terpineol, benzyl alcohol, etc.), hydrocarbon solvents, ether solvents, ester solvents (for example, diethylene glycol monobutyl ether acetate), or naphtha. In order to promote the dispersion of the metal powder, alcoholic solvent such as α-terpineol is preferably used.

Contents of the organic binder resin and the solvent are set in ranges that can render the electrically conductive paste for wiring conductor proper levels of viscosity and rheology which are appropriate for the method (screen printing or the like) of applying the paste onto the surface of the ceramic green sheet. The electrically conductive paste for wiring conductor may also contain dispersants, activators, plasticizers, etc., as required.

The via conductors 8 and 9 are formed by filling the through holes formed in the stacked ceramic green sheets with the electrically conductive paste for via conductor and firing together with the ceramic green sheets.

As the electrically conductive paste for via conductor, a paste that contains a metal powder as an electrically conductive component, inorganic particles made of the same material as the ceramic particles contained in the ceramic green sheet and of average particle diameter smaller than that of the ceramic particles, and an organic binder resin is preferably used. Specifically, the electrically conductive paste for via conductor is prepared by adding a solvent that can dissolve the organic binder resin to the metal powder, the inorganic particles and the organic binder resin, thereby dissolving the organic binder resin.

The metal powder includes Ni powder, a mixture of Cu powder and the Ni powder, or Ni—Cu alloy powder, in a case where the metal powder contained in the electrically conductive paste for wiring conductor is Ni powder. Cu forms solid solution with Ni when fired, so as to achieve satisfactory electrical connection of the via conductors 8 and 9 and the internal electrodes 4 and 5.

In a case where the metal powder is Ni powder or Ni—Cu alloy powder, the metal powder preferably has average particle diameter in a range from 0.1 to 10 µm, in order to prevent the metal powder from aggregating in the electrically conductive paste for via conductor.

In a case where the metal powder is a mixture of Ni powder and Cu powder, it is preferable that the Cu powder has average particle diameter in a range from 0.1 to 1.0 µm and the Ni powder has average particle diameter in a range from 0.1 to 10 µm, in order to prevent each of the metal powders from aggregating in the electrically conductive paste for via conductor.

The inorganic particles may be made of various materials that have compositions similar to that of the ceramic particles contained in the ceramic green sheet, namely the same or similar main component, and hence are capable of shifting the sintering starting temperature of the electrically conductive paste for via conductor as a whole to a higher temperature, due to sintering behavior and temperature characteristics during firing similar to those of the ceramic particles.

In a case where the ceramic particles are made of ceramics consisting mainly of $BaTiO_3$ as described previously, for example, the inorganic particles preferably contains $BaTiO_3$ as the main component. The inorganic particles are, for example, preferably $BaTiO_3$ particles, particles made by crushing calcinated $BaTiO_3$ or particles made by coating either of the particles described above with Mg, Mn, $Y_2O_3$ or the like.

The inorganic particles must have average particle diameter smaller than that of the ceramic particles. In this way, the inorganic particles can have a slightly lower sintering starting temperature than the sintering starting temperature of the ceramic particles, so that the ceramic particles contained in the ceramic green sheets and the inorganic particles contained in the electrically conductive paste for via conductor are bonded together before the ceramic particles are sintered with each other in the ceramic green sheets, and the inorganic particles function as the anchor that fixed the ceramic green sheets and the electrically conductive paste for via conductor together.

As a result, voids can be prevented from appearing on the interface between the dielectric layers 2 and the via conductors 8 and 9 due to the difference in shrinkage behavior between the ceramic green sheets and the electrically conductive paste for via conductor during shrinkage thereof, thereby to provide the ceramic electronic component wherein satisfactory electrical connection is established between the via conductors 8 and 9 and the internal electrodes 4 and 5.

The inorganic particles may have any size as long as the average particle diameter is smaller than that of the ceramic particles. In order to fully achieve the effects described above, however, average particle diameter of the inorganic particles is preferably 0.8 times the average particle diameter of the ceramic particles or smaller. While there is no lower limit to the average particle diameter of the inorganic particles, average particle diameter of the inorganic particles is preferably not less than 0.3 times the average particle diameter of the ceramic particles, because the inorganic particles tend to aggregate due to lower tendency of dispersion of the inorganic particles in the electrically conductive paste for via conductor. For example, when the average particle diameter of the ceramic particles is 0.4 µm, average particle diameter of the inorganic particles is preferably in a range from 0.12 to 0.32 µm, particularly around 0.2 µm.

Content of the inorganic particles in the entire material consisting of the inorganic particles and the metal powder is preferably in a range from 0.1 to 20% by weight. The inorganic particles in a proportion less than 0.1% by weight may lead to insufficient effect of containing the inorganic particles to prevent voids from appearing on the interface between the dielectric layers 2 and the via conductors 8 and 9, thus making it impossible to provide the ceramic electronic component wherein satisfactory electrical connection is established between the via conductors 8 and 9 and the internal electrodes 4 and 5.

When the proportion of the inorganic particles is higher than 20% by weight, equivalent series resistance (ESR) of the laminated ceramic capacitor 1 may become higher, as a result of extraction of the inorganic particles in the interface between the internal electrodes 4 and 5 and the via conductors 8 and 9 during firing, which may hinder satisfactory electrical connection between both components or increase the conductive resistance of the via conductors 8 and 9.

As the organic binder resin, various resins may be used that allow the metal powder and the inorganic particles to disperse evenly therein and can render the electrically conductive paste for via conductor proper levels of viscosity and rheology which are appropriate for the method (screen printing or the like) of filling the through holes formed in the ceramic green sheet. As the organic binder resin, such organic binder resins as indicated for the electrically conductive paste for wiring conductor may be used.

As the solvent, various solvents that enable it to turn the mixture into a paste by dissolving the organic binder resin and dispersing the metal powder and the inorganic particles can be used. As the solvent, such solvents as indicated for use with the electrically conductive paste for wiring conductor may be used.

Contents of the organic binder resin and the solvent may be set within such ranges that give proper levels of viscosity and rheology which are appropriate for the method (screen printing or the like) of filling the through holes formed in the ceramic green sheet with the electrically conductive paste for via conductor.

The electrically conductive paste for via conductor may also contain dispersants, activators, plasticizers, etc., as required.

It is preferable to set the starting temperature $T_1$ for sintering the ceramic particles contained in the ceramic green sheets with the inorganic particles contained in the electrically conductive paste for via conductor, the starting temperature $T_2$ for sintering the ceramic particles with each other and the starting temperature $T_3$ for sintering the inorganic particles with each other are set so as to satisfy both relationships (1) and (2).

$$T_1 < T_2 \quad (1)$$

$$T_1 < T_3 \quad (2)$$

This enables it to bond the ceramic particles and the inorganic particles that have particle diameter smaller than that of the ceramic particles and therefore have a slightly lower sintering starting temperature more reliably in the early stage of firing, prior to sintering of the ceramic particles in the ceramic green sheets and sintering of the inorganic particles in the electrically conductive paste for via conductor. This achieves more satisfactory electrical connection of the via conductors 8 and 9 and the internal electrodes 4 and 5.

The sintering starting temperatures $T_2$ and $T_3$ are preferably set so as to satisfy relationship (3).

$$T_2 \leq T_3 \quad (3)$$

Under this condition, the electrically conductive paste for via conductor shows shrinkage behavior similar to that of the ceramic green sheet.

Therefore, it is made possible to reduce the internal stress generated in the via conductors 8 and 9 and suppress voids and cracks from appearing in the via conductors 8 and 9 due to the shrinkage of the electrically conductive paste for via conductor during firing while the electrically conductive paste for via conductor is fixed in the interface between the paste and the ceramic green sheets, as the ceramic particles and the inorganic particles are bonded together so as to function as the anchor. Thus the via conductors 8 and 9 can be prevented from having higher conductive resistance or breaking, thereby to stabilize the electrical characteristics of the laminated ceramic capacitor 1.

The sintering starting temperatures $T_1$ through $T_3$ may be controlled within the ranges that satisfy the relationships (1) through (3) by changing the compositions and average particle diameters of the ceramic particles and the inorganic particles, or having the ceramic green sheets contain the sintering aid while adjusting the content of the sintering aid. Specifically, it is preferable to arrange the foregoing compositions of the ceramic particles and the inorganic particles, adjust the average particle diameters of the ceramic particles and the inorganic particles in the foregoing range, and set the amount of the sintering aid to be contained in the ceramic green sheet in a range from 0.5 to 3.0 parts by weight for 100 parts by weight of the ceramic particles.

The external electrodes 10 and 11 are formed by firing the ceramic green sheets to form the dielectric block 3 and then applying an electrically conductive paste for wiring conductor which is similar to that used to form the internal electrodes 4 and 5, by screen printing or the like in a predetermined planar configuration on the top surface 6 and the bottom surface 7 of the dielectric block 3.

FIGS. 2 through 6 are sectional views showing the steps of manufacturing the laminated ceramic capacitor 1 according to the method of the present invention. In this method, the ceramic green sheets 14 that would make the dielectric layers 2 are first prepared.

Figure 2:
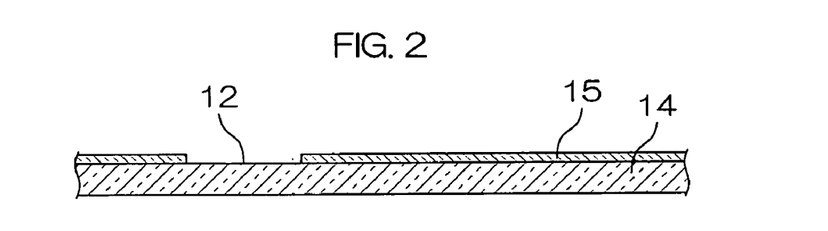
FIGS. 2 through 6 are sectional views showing the steps of manufacturing the laminated ceramic capacitor of FIG. 1 according to the method of the present invention.

Then the electrically conductive paste for wiring conductor 15 is applied to the surfaces of the ceramic green sheets 14 that would make the even-numbered dielectric layers 2 counting from the top surface 6 of the dielectric block 3 in a predetermined planar configuration of the internal electrode 4 (FIG. 2).

Specifically, the electrically conductive paste for wiring conductor 15 is applied over the position where the through holes 18 are to be formed, so as to touch the electrically conductive paste for via conductor 19 that fills the through holes 18 while providing an area 12 where the electrically conductive paste for wiring conductor 15 would not be applied around the position where the through holes 16 are to be formed in the subsequent process, so that the electrically conductive paste for wiring conductor does not touch the electrically conductive paste for via conductor 17 that fills the through holes 16.

Figure 3:
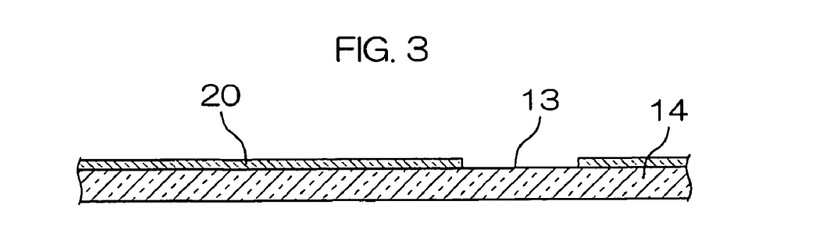

Also the electrically conductive paste for wiring conductor 20 is applied to the surfaces of the ceramic green sheets 14 that would make the odd-numbered dielectric layers 2 (except for the top layer, namely the first dielectric layer 2) counting from the top surface 6 of the dielectric block 3 in a predetermined planar configuration of the internal electrode 5 (FIG. 3).

Specifically, the electrically conductive paste for wiring conductor 20 is applied over the position where the through holes 16 are to be formed, so as to touch the electrically conductive paste for via conductor 17 that fills the through holes 16 while providing an area 13 where the electrically conductive paste for wiring conductor would not be applied around the position where the through holes 18 are to be formed in the subsequent process, so that the electrically conductive paste for wiring conductor does not touch the electrically conductive paste for via conductor 19 that fills the through holes 18.

The individual ceramic green sheet 14 may be formed with the dimensions of the individual dielectric layer 2. In view of the efficiency of manufacturing, however, it is preferable to form the individual ceramic green sheet 14 in a size that includes a plurality of areas each corresponding to the individual dielectric layer 2, apply the electrically conductive pastes for wiring conductor 15 and 20 to the areas, stack the ceramic green sheets, form the through holes 16 and 18, fill the through holes with the electrically conductive pastes for via conductors 17 and 19 so as to form the stacked body 21 and cutting the stacked body 21 into a plurality of stacked bodies that become the dielectric blocks 3.

Figure 4:
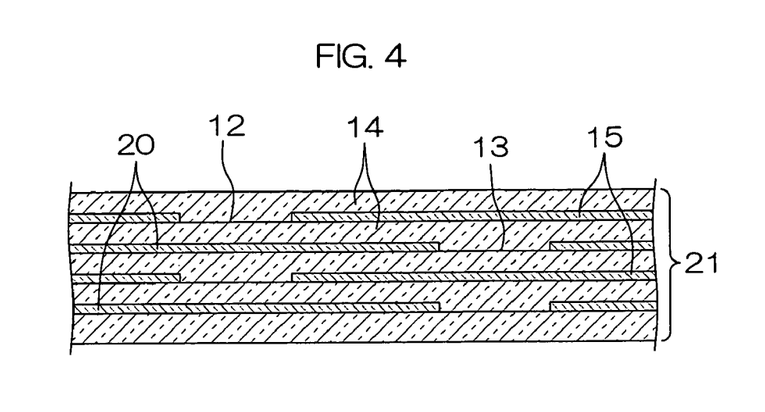

Then the two kinds of ceramic green sheets 14 are placed alternately one on another, each in plurality, while making alignment, and placing the ceramic green sheet 14 that does not bear the electrically conductive pastes for wiring conductors 15 and 20 on top of the stack, and the stack 21 is pressed on the direction perpendicular to the layers (FIG. 4).

Instead of the two kinds of ceramic green sheets 14 that are placed alternately one on another, only one kind of ceramic green sheets 14 may be used such that the ceramic green sheets having the through holes 16 and 18 formed at the same positions and the electrically conductive pastes for wiring conductors 15 and 20 applied in the same configurations are stacked in opposing orientations. This method decreases the number of different kinds of the ceramic green sheets 14 and simplifies the manufacturing process.

Figure 5:
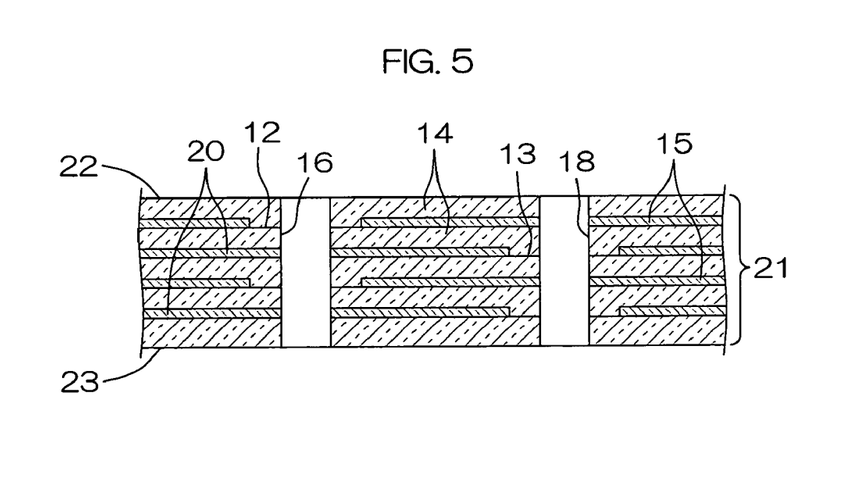
Figure 6:
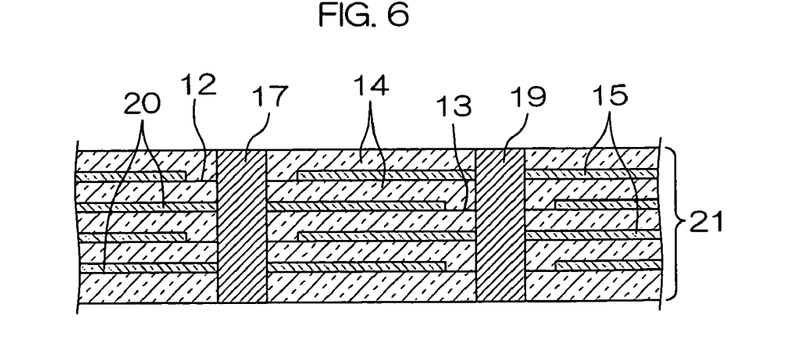

Then the through holes 16 and 18 are formed to penetrate from the top surface 22 to the bottom surface 23 of the stacked body 21 by, for example, irradiating with laser beam of UV YAG laser oscillating at wavelength of 350 nm, while removing the electrically conductive paste for via conductor that covers the through holes 16 and 18 (FIG. 5).

The through hole 16 is formed to penetrate the center of the area 12 where the electrically conductive paste for wiring conductor 15 is not applied in the even-numbered ceramic green sheet 14 counting from the top surface of the stacked body 21, and overlap the area where the electrically conductive paste for wiring conductor 20 has been applied in the odd-numbered ceramic green sheet 14 counting from the top surface of the stacked body 21.

The through hole 18 is formed to penetrate the center of the area 13 where the electrically conductive paste for wiring conductor 20 is not applied in the odd-numbered ceramic green sheet 14 counting from the top surface of the stacked body 21, and overlap the area where the electrically conductive paste for wiring conductor 15 has been applied in the even-numbered ceramic green sheet 14 counting from the top surface of the stacked body 21.

When the through holes 16 and 18 are formed by means of laser beam, it is preferable to evacuate the ambient air and remove decomposed organic materials such as the organic binder resin, loose ceramic powder and the like. The through holes 16 and 18 may also be formed by means of a micro-drill, punching or the like. The stacked body 21 wherein the through holes 16 and 18 are formed is preferably subjected to ultrasonic cleaning while being immersed in water, so as to remove the machining chips.

The through holes 16 and 18 that have been formed are filled with the electrically conductive pastes for via conductor 17 and 19 by screen printing or the like (FIG. 5). This causes the electrically conductive paste for wiring conductor 20, applied to the surface of the odd-numbered ceramic green sheet 14 counting from the top surface of the stacked body 21, which is exposed in the through hole 16 and the electrically conductive paste for via conductor 17 that fills the through hole 16 to make contact with each other.

The electrically conductive paste for wiring conductor 15, applied to the surface of the even-numbered ceramic green sheet 14 counting from the top surface of the stacked body 21, which is exposed in the through hole 18 and the electrically conductive paste for via conductor 19 that fills the through holes 18 also make contact with each other.

Then, in a case where the individual ceramic green sheet 14 is formed in a size that includes a plurality of areas each corresponding to the individual dielectric layer 2 as described previously, the stacked body 21 is cut into individual areas by means of, for example, a shear cutter. When the stacked body 21 is too thick, it may be cut by dicing.

The individual stacked bodies that have been cut are heated to a temperature from 250 to 400° C. in a heating furnace, so as to remove the organic binder resin and other organic matters. Then the stacked bodies are heated and fired to a temperature from 1250 to 1300° C. in a firing furnace so as to form the dielectric block 3 shown in FIG. 1. Then the external electrodes 10 and 11 are formed on the top surface 6 and the bottom surface 7 of the dielectric block 3, respectively, thereby completing the laminated ceramic capacitor 1 shown in FIG. 1.

The firing process may be carried out in such a manner that the stacked body taken out of the heating furnace is put into the firing furnace of which temperature is set in the range described above, so that the temperature of the stacked body is raised gradually, or the stacked body taken out of the heating furnace is put into the firing furnace of which temperature similar to the temperature of the heating furnace, and the temperature of the firing furnace is raised gradually.

In the firing process described above, the component having the lowest sintering starting temperature is sintered first, followed by sintering of the other components having higher sintering starting temperatures. During heating, the ceramic particles contained in the ceramic green sheets 14 and the inorganic particles contained in the electrically conductive paste for via conductor 17 and 19 that have average particle diameter smaller than that of the ceramic particles and therefore have slightly lower sintering starting temperatures can be bonded together reliably in the interface between the ceramic green sheets 14 and the electrically conductive pastes for via conductor 17 and 19 in the early stage of firing, before the ceramic particles are sintered with each other in the ceramic green sheets 14. This causes the ceramic particles and the inorganic particles that have been bonded to function as the anchor, and achieves satisfactory electrical connection of the via conductors 8 and 9 and the internal electrodes 4 and 5 that are formed by subsequent firing.

When the sintering starting temperatures $T_1$ through $T_3$ are controlled within the ranges that satisfy the relationships (1) through (3) by changing the compositions and average particle diameters of the ceramic particles and the inorganic particles or adjusting the amount of the sintering aid to be contained in the ceramic green sheet, more satisfactory electrical connection can be established between the via conductors 8 and 9 and the internal electrodes 4 and 5. Moreover, the via conductors 8 and 9 can be prevented from having higher conductive resistance or breaking, thus making it possible to stabilize the electrical characteristics of the laminated ceramic capacitor 1.

Figure 7:
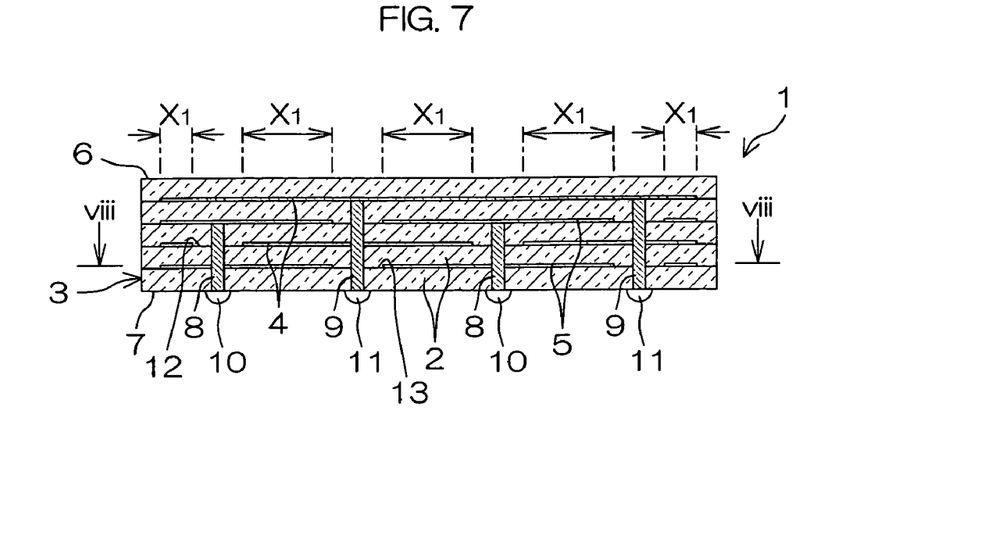
FIG. 7 is a sectional view showing a sectional plane of the laminated ceramic capacitor perpendicular to the layers, as another example of the ceramic electronic component of the present invention.
Figure 8:
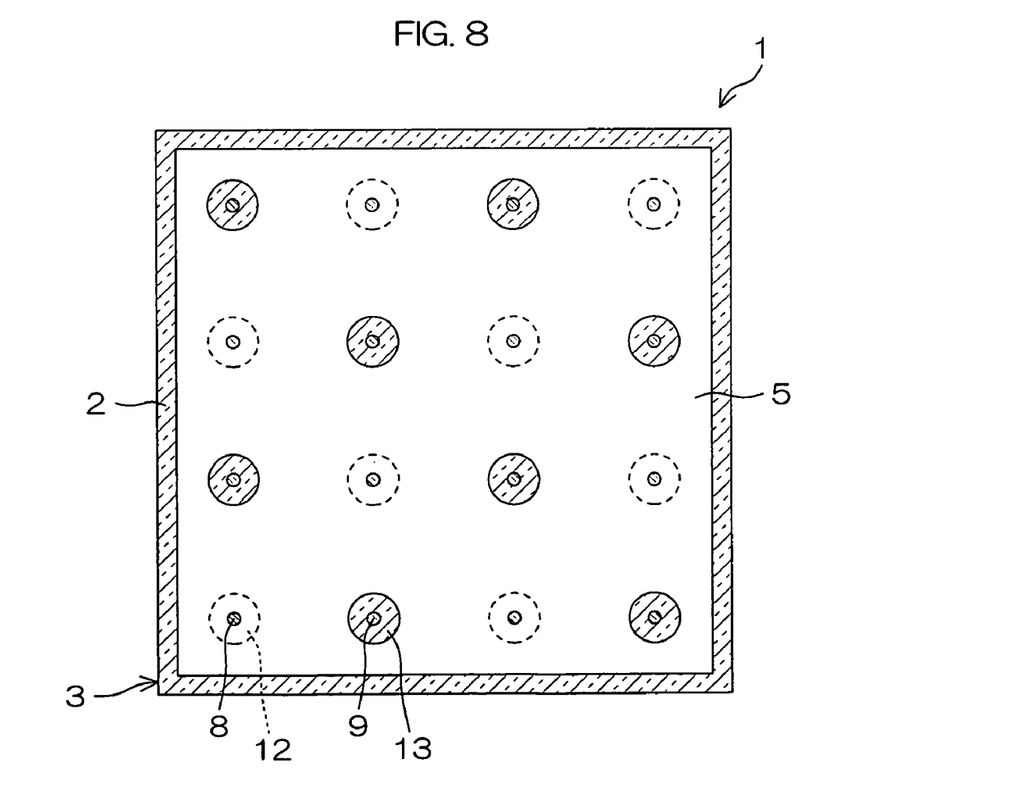
FIG. 8 is a sectional view taken along lines viii-viii of FIG. 7.

FIG. 7 is a sectional view showing a sectional plane of the laminated ceramic capacitor 1 perpendicular to the layers, as another example of the ceramic electronic component of the present invention. FIG. 8 is a sectional view taken along lines viii-viii of FIG. 7.

As shown in FIG. 7 and FIG. 8, the laminated ceramic capacitor 1 of this example is different from the previous example in that the via conductors 8 and 9 are exposed only on the bottom surface 7 of the dielectric block 3 and are connected to the external electrodes 10 and 11 formed on the bottom surface 7, that the dielectric layers 2 and the internal electrodes 4 and 5 are formed in square planar configuration, and that a set of eight via conductors 8 and eight via conductors 9 are disposed in a square array of 4 by 4 in an alternate arrangement in the square dielectric layer 2. With other respects of the constitution, this example is identical with the previous example and identical components will be denoted with identical reference numerals and description thereof will be omitted. One of the via conductors 8 and 9 (for example, the via conductors 9) may be exposed only on the top surface 6 of the dielectric block 3 and connected with the external electrode 11 formed on the top surface 6.

In the laminated ceramic capacitor 1 of the example described above, voids can be prevented from appearing on the interface between the dielectric layers 2 and the via conductors 8 and 9 by employing the constitution of the present invention, such that the via conductors 8 and 9 contain inorganic particles of the same material as the ceramic particles that constitute the dielectric layer 2 and of average particle diameter smaller than that of the ceramic particles, thereby to provide satisfactory electrical connection between the via conductors 8 and 9 and the internal electrodes 4 and 5.

The laminated ceramic capacitor 1 of the example described above can be manufactured by the method of the present invention, wherein the ceramic particles and the inorganic particles can be bonded together reliably in the interface between the ceramic green sheets and the electrically conductive paste for via conductor in the early stage of firing, before the ceramic particles are sintered with each other in the ceramic green sheets. This achieves more satisfactory electrical connection of the via conductors 8 and 9 and the internal electrodes 4 and 5.

Moreover, by controlling the sintering starting temperatures $T_1$ through $T_3$ within the ranges that satisfy the relationships (1) through (3) by changing the compositions and average particle diameters of the ceramic particles and the inorganic particles or adjusting the amount of the sintering aid to be contained in the ceramic green sheet, more satisfactory electrical connection can be established between the via conductors 8 and 9 and the internal electrodes 4 and 5, while stabilizing the electrical characteristics of the laminated ceramic capacitor 1.

When the via conductors 8 and 9 connected to different internal electrodes 4 and 5 are formed in plurality in each dielectric block 3 so as to be disposed in proximity within a predetermined distance from each other as in the example shown in the figure, magnetic fluxes generated by adjacent via conductors 8 and 9 cancel each other, so as to decrease the parasitic inductance of the laminated ceramic capacitor 1 in a stable manner. In the laminated ceramic capacitor 1 shown in FIG. 1, similar effect can be achieved by disposing the via conductors 8 and 9 in proximity within a predetermined distance from each other.

Constitution of the present invention is not limited to those of the embodiments described above, and various improvements and modifications can be made without departing from the scope of the present invention.

For example, a plurality of capacitors that are electrically independent from each other may be formed in one dielectric block 3. For example, capacitors of different values of capacitance may also be incorporated in the same dielectric block 3 by varying the surface areas of the internal electrodes 4 and 5 functioning as individual capacitors.

It should be understood that the constitution of the present invention may be applied to a ceramic electronic component other than the laminated ceramic capacitor 1.

What is claimed is:

1. A method for manufacturing a ceramic electronic component comprising:
    forming through holes in ceramic green sheets containing first ceramic particles;
    filling the through holes with a paste containing second ceramic particles wherein the second ceramic particles are the same material as the first ceramic particles and an average particle diameter of the second ceramic particles is smaller than that of the first ceramic particles; and
    firing the ceramic green sheets and the paste,
    wherein a sintering initiation temperature $T_1$ at which the first ceramic particles start sintering with the second ceramic particles at a boundary of the ceramic green sheets and the paste, a sintering initiation temperature $T_2$ at which the first ceramic particles inside the ceramic green sheets start sintering with each other and a sintering initiation temperature $T_3$ at which the second ceramic particles inside the paste start sintering with each other are set so as to satisfy both relationships (1) and (2):

$$T_1 < T_2 \tag{1}$$

$$T_1 < T_3 \tag{2}$$

2. The method according to claim 1, wherein the sintering initiation temperatures $T_2$ and $T_3$ are set so as to satisfy relationship (3):

$$T_2 \leq T_3 \tag{3}$$

3. A method for manufacturing a ceramic electronic component comprising:
    forming through holes in ceramic green sheets containing first ceramic particles;
    filling the through holes with a paste containing second ceramic particles wherein the second ceramic particles are the same material as the first ceramic particles and an average particle diameter of the second ceramic particles is smaller than that of the first ceramic particles; and
    firing the ceramic green sheets and the paste,
    wherein the ceramic green sheets contain a first sintering aid and the paste contains a second sintering aid, and the firing step comprises the steps of:
    sintering the first particles with the second particles at a boundary between the ceramic green sheets and the paste by using the first sintering aid and/or the second sintering aid;
    sintering the first ceramic particles with each other in the ceramic green sheets using the first sintering aid after the sintering step of the first and second ceramic particles starts; and
    sintering the second ceramic particles using the second sintering aid after the sintering step of the first and second ceramic particles starts.

4. The method according to claim 3, wherein the first sintering aid is the same material as the second sintering aid and the content of the first sintering aid in the ceramic green sheet is more than the content of the second sintering aid in the paste.

5. A method for manufacturing a ceramic electronic component comprising a ceramic sintered body having an electric circuit therein, comprising:
    preparing ceramic green sheets containing first ceramic particles and having through holes therein;
    providing a paste containing second ceramic particles;
    filling the through holes with the paste;
    stacking the ceramic green sheets; and
    sintering first ceramic particles with the second ceramic particles at the boundary between the ceramic green sheets and the paste followed by sintering the first ceramic particles inside the ceramic green sheets and sintering the second ceramic particles inside the paste.

6. The method according to claim 5, wherein the second ceramic particles are the same material as the first ceramic particles and an average particle size of the second particles is smaller than that of the first ceramic particles.

* * * * *